United States Patent
Kang et al.

(10) Patent No.: US 9,577,677 B2
(45) Date of Patent: Feb. 21, 2017

(54) DEVICE AND METHOD FOR TRANSMITTING DATA USING CONVOLUTIONAL TURBO CODE (CTC) ENCODER IN MOBILE COMMUNICATION SYSTEM

(75) Inventors: Seunghyun Kang, Anyang-si (KR); Jinsam Kwak, Anyang-si (KR)

(73) Assignee: LG ELECTRONICS INC., Seoul (KR)

( * ) Notice: Subject to any disclaimer, the term of this patent is extended or adjusted under 35 U.S.C. 154(b) by 240 days.

(21) Appl. No.: 14/358,671

(22) PCT Filed: Dec. 1, 2011

(86) PCT No.: PCT/KR2011/009256
§ 371 (c)(1), (2), (4) Date: May 15, 2014

(87) PCT Pub. No.: WO2013/081216
PCT Pub. Date: Jun. 6, 2013

(65) Prior Publication Data
US 2014/0304571 A1    Oct. 9, 2014

(51) Int. Cl.
*H03M 13/25* (2006.01)
*H03M 13/27* (2006.01)
(Continued)

(52) U.S. Cl.
CPC ....... *H03M 13/258* (2013.01); *H03M 13/2753* (2013.01); *H03M 13/2775* (2013.01);
(Continued)

(58) Field of Classification Search
CPC .... H03M 13/23; H03M 13/235; H03M 13/25; H03M 13/253; H03M 13/256; H03M 13/258; H03M 13/27–13/2796; H03M 13/29; H03M 13/2903; H03M 13/2939; H03M 13/2957; H03M 13/296
See application file for complete search history.

(56) References Cited

U.S. PATENT DOCUMENTS

| | | |
|---|---|---|
| 2005/0278603 A1 | 12/2005 | Berens et al. |
| 2011/0113307 A1* | 5/2011 | Kang ................ H03M 13/2903 714/786 |

FOREIGN PATENT DOCUMENTS

| | | |
|---|---|---|
| KR | 10-2006-0121312 | 11/2006 |
| KR | 10-2008-0069356 | 7/2008 |

(Continued)

OTHER PUBLICATIONS

Brian Johnson, et al , "Proposed Fix to CTC Interleaver Parameters to Enable Efficient Parallel Decoder Designs (16.3.11.1.5.1)", Jul. 9, 2010 , IEEE , IEEE C802.16m-10/0922.*

(Continued)

*Primary Examiner* — Albert Decady
*Assistant Examiner* — Christian Dorman
(74) *Attorney, Agent, or Firm* — Lee Hong Degerman Kang Waimey (57) ABSTRACT

A method for transmitting data using a convolutional turbo code (CTC) encoder. Specifically, the method comprises: encoding input data bits, which have been input through two input ports of the CTC encoder; interleaving the input data bits using four CTC interleaver parameters $P_0$, $P_1$, $P_2$ and $P_3$ corresponding to sizes of the input data bits; encoding the interleaved data bits; and selectively transmitting the input data bits, the first encoded bits and the second encoded bits, in accordance with a predetermined coding rate. Here, $P_0$ is a relative prime number to N, which is ½ of the size of each of the input data bits, $P_2$ has a value of N−1, and an absolute value of a difference between $P_1$ and $P_3$ is 1.

8 Claims, 9 Drawing Sheets

(51) Int. Cl.
 *H03M 13/00* (2006.01)
 *H03M 13/29* (2006.01)
(52) U.S. Cl.
 CPC ..... *H03M 13/296* (2013.01); *H03M 13/6544* (2013.01); *H03M 13/29* (2013.01); *H03M 13/2903* (2013.01); *H03M 13/2939* (2013.01); *H03M 13/2957* (2013.01)

(56) References Cited

FOREIGN PATENT DOCUMENTS

| | | | | |
|---|---|---|---|---|
| KR | 10-2010-0092215 | 8/2010 | | |
| KR | 10-2010-0118988 | 11/2010 | | |
| WO | 2010/008165 A2 * | 1/2010 | ............ | H03M 13/27 |

OTHER PUBLICATIONS

PCT International Application No. PCT/KR2011/009256, Written Opinion of the International Searching Authority dated Aug. 29, 2012, 13 pages.

PCT International Application No. PCT/KR2011/009256, Written Opinion of the International Searching Authority dated Aug. 29, 2012, 10 pages.

\* cited by examiner

DEVICE AND METHOD FOR TRANSMITTING DATA USING CONVOLUTIONAL TURBO CODE (CTC) ENCODER IN MOBILE COMMUNICATION SYSTEM

CROSS-REFERENCE TO RELATED APPLICATIONS

This application is the National Stage filing under 35 U.S.C. 371 of International Application No. PCT/KR2011/009256, filed on Dec. 1, 2011, the contents of which are all hereby incorporated by reference herein in their entirety.

TECHNICAL FIELD

The present invention relates to a device and method for transmitting data, and more particularly, to a device and method for enabling a transmitting side to transmit data using a convolutional turbo code (CTC) encoder in a mobile communication system.

BACKGROUND ART

In a wireless communication system, portions of transmission data may sometimes be lost at once due to fading. If consecutive data bits are lost at once, this error cannot be recovered from even when a very excellent error correction code is used.

In a wireless communication system, a transmitting side transmits encoded transmission data streams after changing the order of the transmission data streams according to a specific pattern using a channel interleaving method rather than transmitting the data streams in an order in which the data streams are input. That is, a burst error that frequently occurs on a radio link may be changed to a random error using channel interleaving.

When error bits are sparsely present among sequences of the encoded transmission data, the error bits may be corrected using an error correction code such as a convolutional code, a turbo code, or a Low Density Parity Check (LDPC) code.

Basically, turbo coding, which is a channel coding technology, is a scheme which connects convolutional codes through parallel concatenation. The Convolutional Turbo Code (CTC) is one of the channel codes used in mobile Internet services.

As is well known, a next-generation mobile communication system requires reliable transmission of multimedia data at a high speed and requires robust channel coding and an efficient modulation scheme in order to increase reliability of high-speed data transmission. Accordingly, options enabling high-speed data transmission have been suggested and introduced in many countries in accordance with specifications of the options. As a result, various coding schemes such as convolutional coding or turbo coding have been suggested. Such channel coding schemes exhibit better performance depending on an interleaver size or a data block size corresponding to the interleaver size. Thus, intensive studies have been carried out on an interleaver that greatly affects turbo code performance.

DISCLOSURE

Technical Problem

An object of the present invention devised to solve the conventional problem is to provide a method for enabling a transmitting side to transmit data using a Convolutional Turbo Code (CTC) encoder, which supports parallel order 2, in a mobile communication system.

It will be appreciated by persons skilled in the art that the objects that could be achieved with the present invention are not limited to what has been particularly described hereinabove and the above and other objects that the present invention could achieve will be more clearly understood from the following detailed description.

Technical Solution

In one aspect of the present invention, a method for transmitting data using a convolutional turbo code (CTC) encoder from a transmitting side in a mobile communication system comprises a first encoding to output first encoded bits by encoding input data bits, which have been input through two input ports of the CTC encoder; interleaving the input data bits using four CTC interleaver parameters $P_0$, $P_1$, $P_2$ and $P_3$ corresponding to sizes of the input data bits; a second encoding to output second encoded bits by encoding the interleaved data bits; and selectively transmitting, to a receiving side, the input data bits, the first encoded bits and the second encoded bits, in accordance with a predetermined coding rate, wherein, with respect to the CTC interleaver parameters corresponding to the sizes of the input data bits, P0 is a relative prime number to N, which is ½ of the size of each of the input data bits, $P_2$ has a value of N−1, and an absolute value of a difference between $P_1$ and $P_3$ is 1.

In another aspect of the present invention, a mobile station in a mobile communication system comprises a first convolutional turbo code (CTC) encoder encoding input data bits, which have been input through two input ports, to output first encoded bits; a CTC interleaver interleaving the input data bits using four CTC interleaver parameters $P_0$, $P_1$, $P_2$ and $P_3$ corresponding to sizes of the input data bits; a second CTC encoder encoding the interleaved data bits to output second encoded bits; and a transmission module selectively transmitting, to a receiving side, the input data bits, the first encoded bits and the second encoded bits, in accordance with a predetermined coding rate, wherein, with respect to the CTC interleaver parameters corresponding to the sizes of the input data bits, $P_0$ is a relative prime number to N, which is ½ of the size of each of the input data bits, $P_2$ has a value of N−1, and an absolute value of the difference between $P_1$ and $P_3$ is 1.

Preferably, N which is ½ of the size of each of the input data bits satisfies $$\frac{N}{2} \mod 4 = 2.$$

Alternatively, the size of each of the input data bits is one of 88, 104, 120, 136, 152, 200, 216, 248, 456 and 568.

More preferably, the CTC interleaver parameters $P_0$, $P_1$, $P_2$ and $P_3$ corresponding to the sizes of the input data bits are defined by the following Table:

TABLE

| $N_{EP}$ | N | $P_0$ | $P_1$ | $P_2$ | $P_3$ |
|---|---|---|---|---|---|
| 88 | 44 | 29 | 28 | 43 | 29 |
| 104 | 52 | 11 | 1 | 51 | 0 |
| 120 | 60 | 19 | 58 | 59 | 59 |
| 136 | 68 | 39 | 37 | 67 | 36 |

TABLE-continued

| $N_{EP}$ | N | $P_0$ | $P_1$ | $P_2$ | $P_3$ |
|---|---|---|---|---|---|
| 152 | 76 | 29 | 39 | 75 | 38 |
| 200 | 100 | 27 | 97 | 99 | 96 |
| 216 | 108 | 41 | 28 | 107 | 29 |
| 248 | 124 | 35 | 53 | 123 | 52 |
| 456 | 228 | 13 | 192 | 227 | 193 |
| 568 | 284 | 23 | 50 | 283 | 51 |

Advantageous Effects

According to the present invention, the transmitting side may effectively transmit data using a Convolutional Turbo Code (CTC) encoder, which supports parallel order 2.

It will be appreciated by persons skilled in the art that that the effects that could be achieved with the present invention are not limited to what has been particularly described hereinabove and other advantages of the present invention will be more clearly understood from the following detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

BEST MODE FOR CARRYING OUT THE INVENTION

Hereinafter, the preferred embodiments of the present invention will be described with reference to the accompanying drawings. It is to be understood that the detailed description, which will be disclosed along with the accompanying drawings, is intended to describe the exemplary embodiments of the present invention, and is not intended to describe a unique embodiment with which the present invention can be carried out. The following detailed description includes detailed matters to provide full understanding of the present invention. However, it will be apparent to those skilled in the art that the present invention can be carried out without the detailed matters. For example, the following description will be made based on, but not limited to, some terminologies. And, other random terminologies may be designated to refer to the same meaning. Wherever possible, the same reference numbers will be used throughout the drawings to refer to the same or like parts.

In the description, when some part "includes" some element, unless specified otherwise, it means that the corresponding part may further include any other element.

The technology disclosed hereinafter may be used for various communication systems that can provide various communication services such as voice and packet data. The technology of the communication system may be used in a downlink or uplink. A base station may be replaced with terms such as a fixed station, Node B, eNode B (eNB), access point, and ABS. Also, a mobile station (MS) may be replaced with terms such as a user equipment (UE), a subscriber station (SS), a mobile subscriber station (MSS), AMS, and a mobile terminal.

Furthermore, a transmitting side means a node that transmits data services or voice services while a receiving side means a node that receives data services or voice services. Accordingly, in the uplink, the mobile station could be a transmitting side while the base station could be a receiving side. Likewise, in the downlink, the mobile station could be a receiving side while the base station could be a transmitting side.

Meanwhile, in the present invention, examples of the mobile station include a personal digital assistant (PDA), a cellular phone, a personal communication service (PCS) phone, a global system for mobile (GSM) phone, a wideband CDMA (WCDMA) phone, and a mobile broadband system (MBS) phone.

The embodiments of the present invention may be supported by standard documents disclosed in at least one of wireless access systems, i.e., IEEE (Institute of Electrical and Electronics Engineers) 802 system, 3GPP system, 3GPP LTE (3rd Generation Partnership Project Long Term Evolution) system, and 3GPP2 system. Namely, among the embodiments of the present invention, steps or parts which are not described to clarify technical spirits of the present invention may be supported by the above standard documents. Also, all terminologies disclosed herein may be described by the above standard documents.

Specific terminologies used in the following description are provided to assist understanding of the present invention, and various modifications may be made in the specific terminologies within the range that they do not depart from technical spirits of the present invention.

Figure 1:
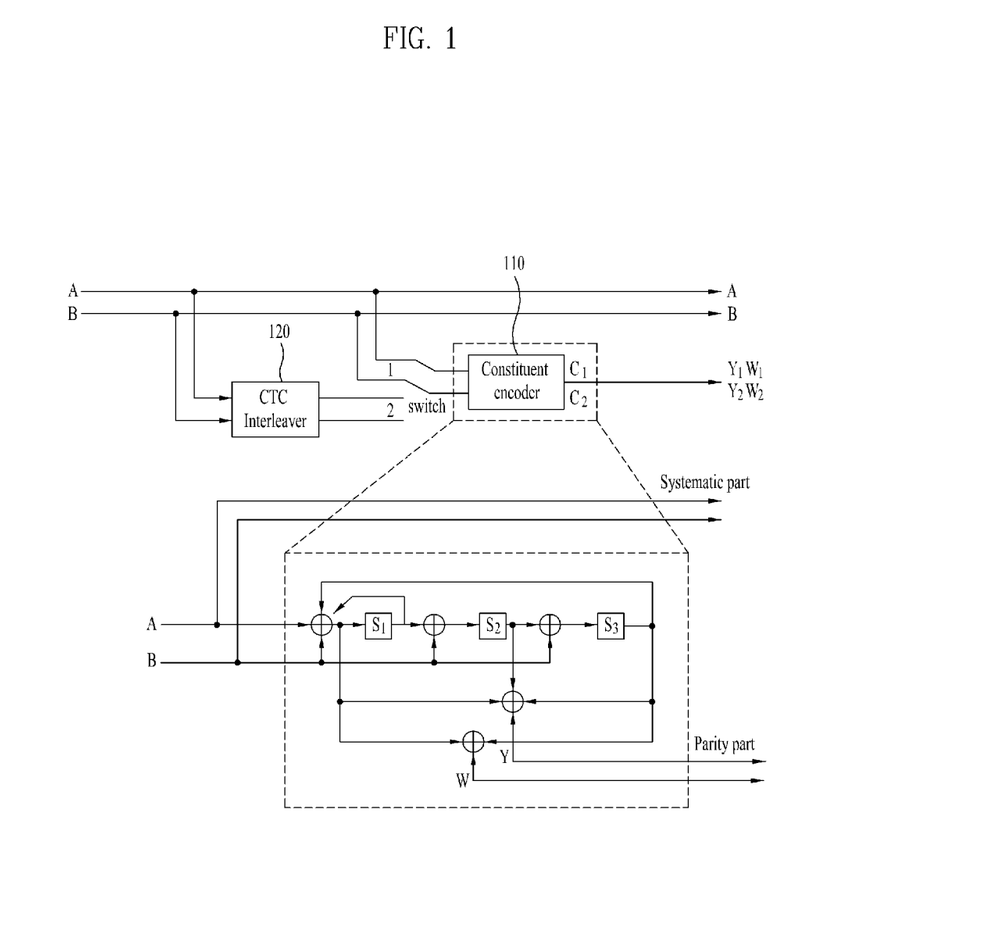
FIG. 1 is a diagram illustrating a Convolutional Turbo Code (CTC) encoder.

FIG. 1 is a diagram illustrating a preferred embodiment of a data transmission device for transmitting data using a convolution turbo code (CTC) encoder.

Figure 2:
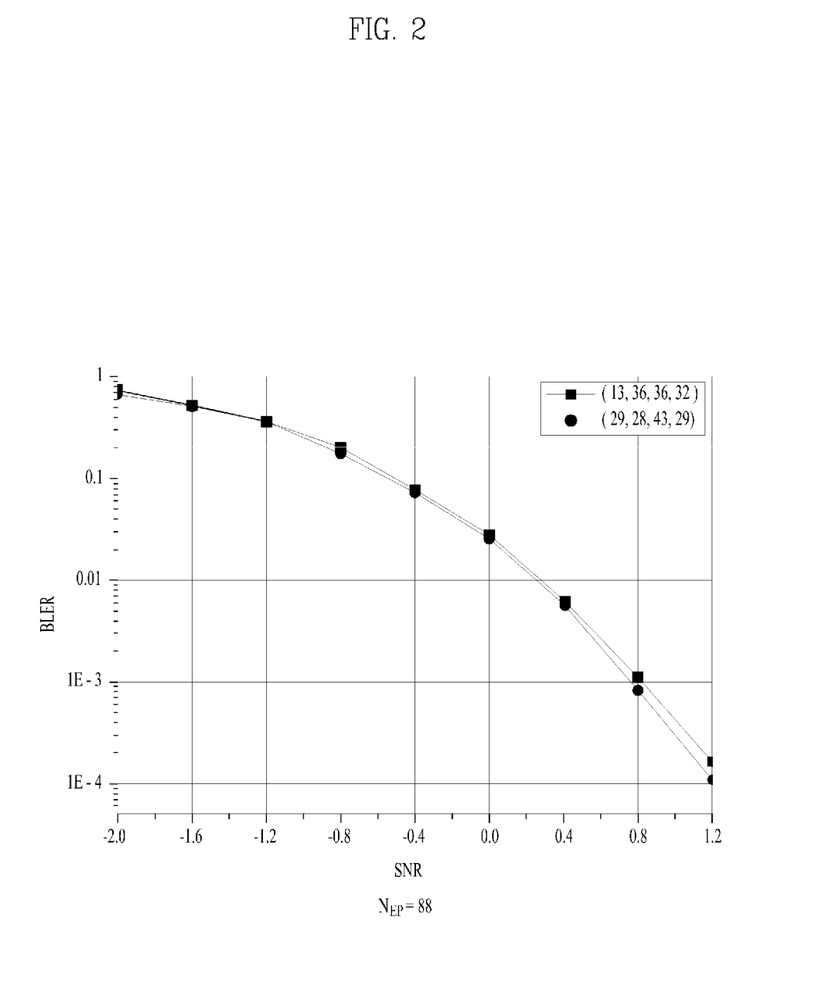
FIGS. 2 to 9 are diagrams illustrating a BLock Error Rate (BLER) for each of a current CTC interleaver parameter in Table 3 and a CTC interleaver parameter of the present invention in Table 4.
Figure 3:
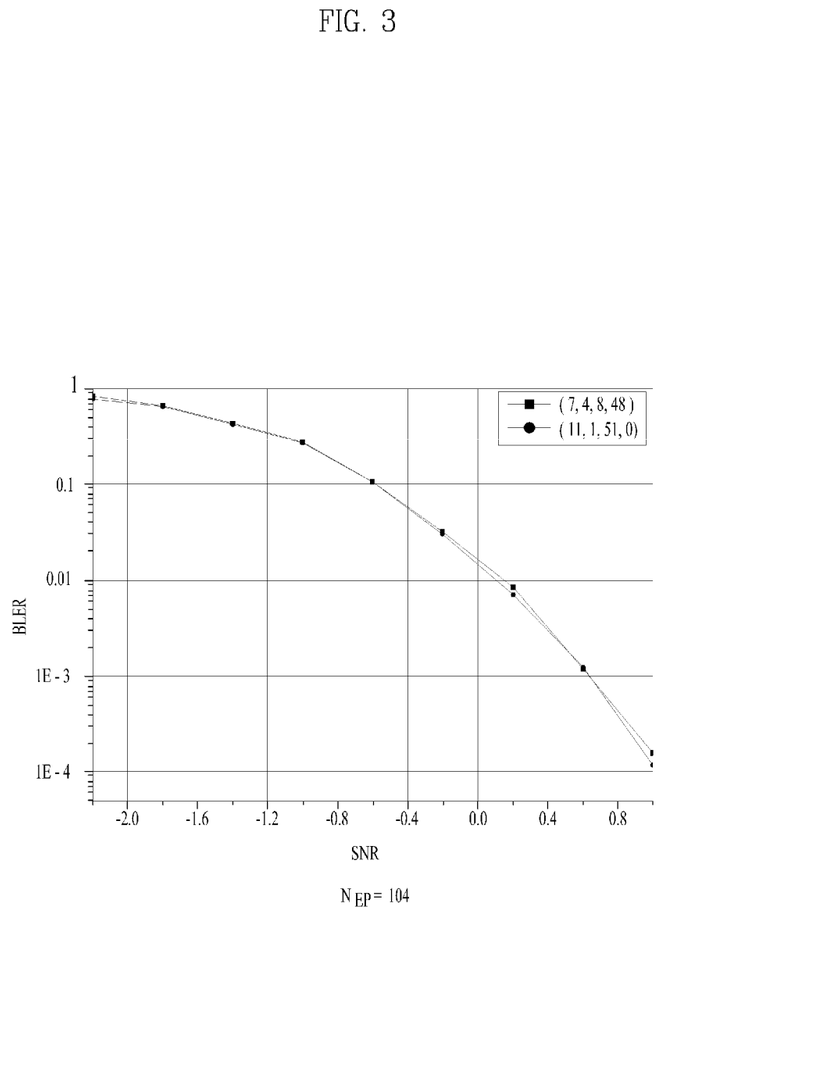
Figure 4:
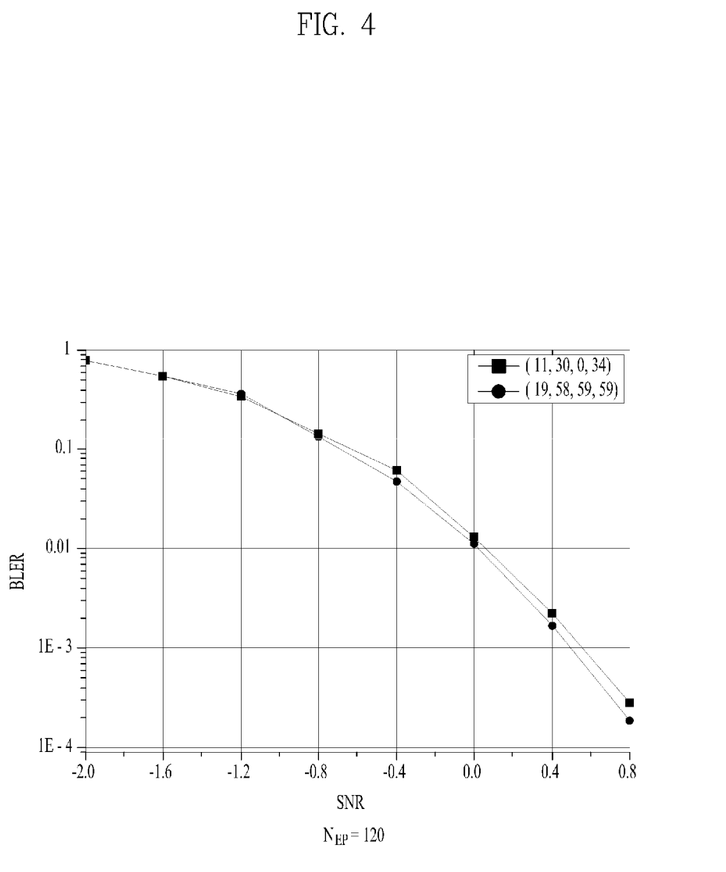
Figure 5:
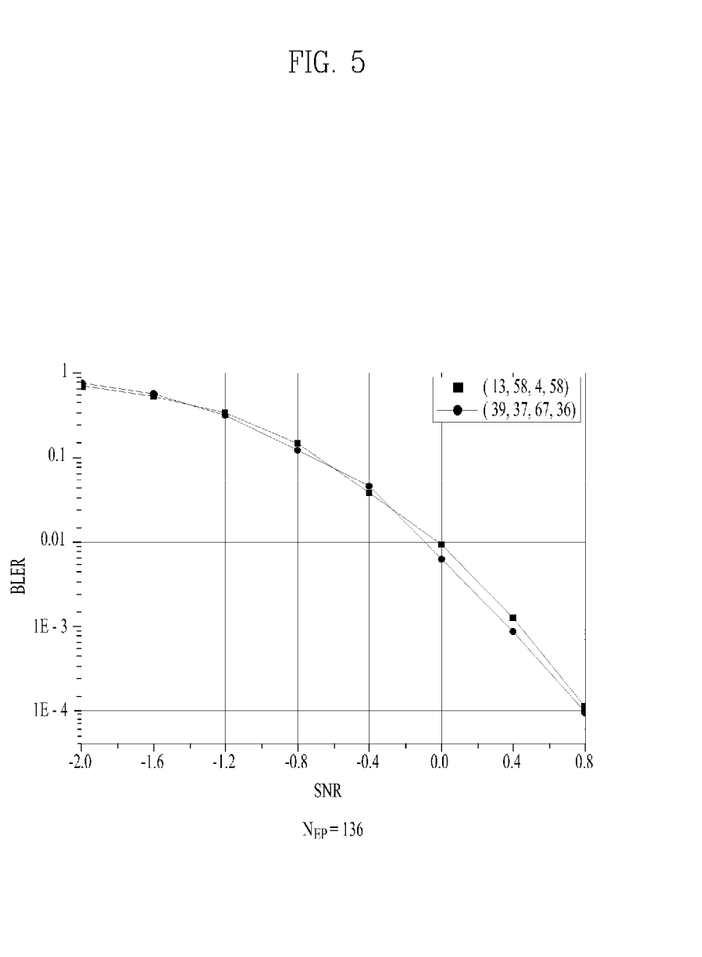
Figure 6:
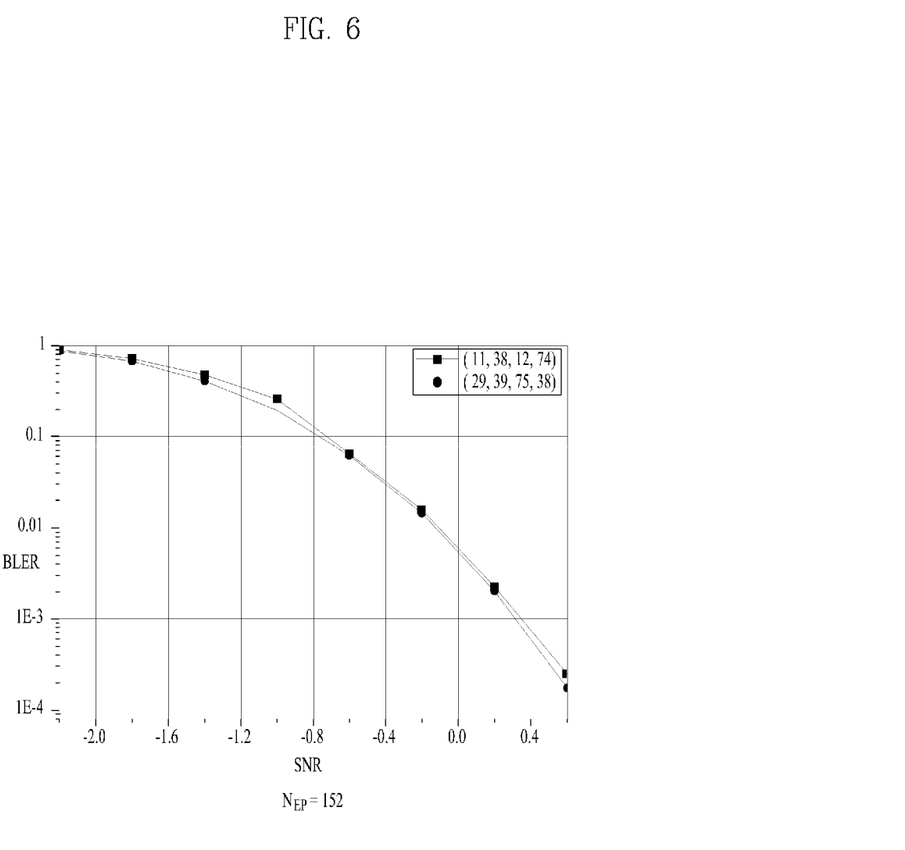
Figure 7:
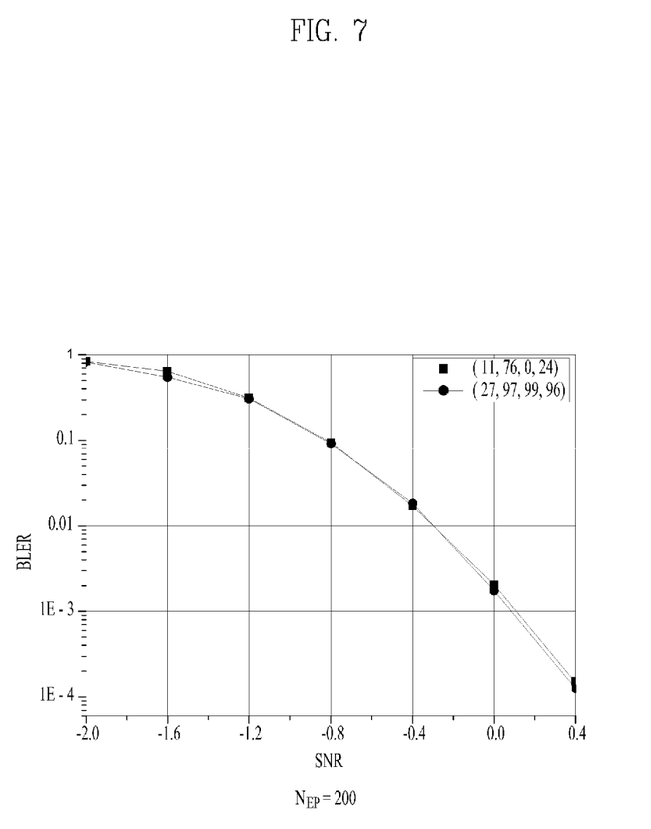
Figure 8:
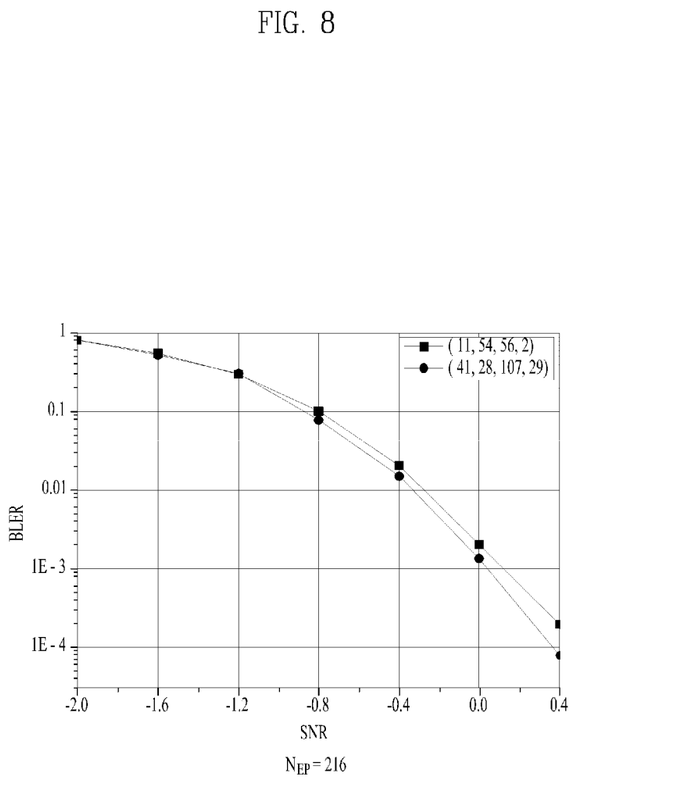
Figure 9:
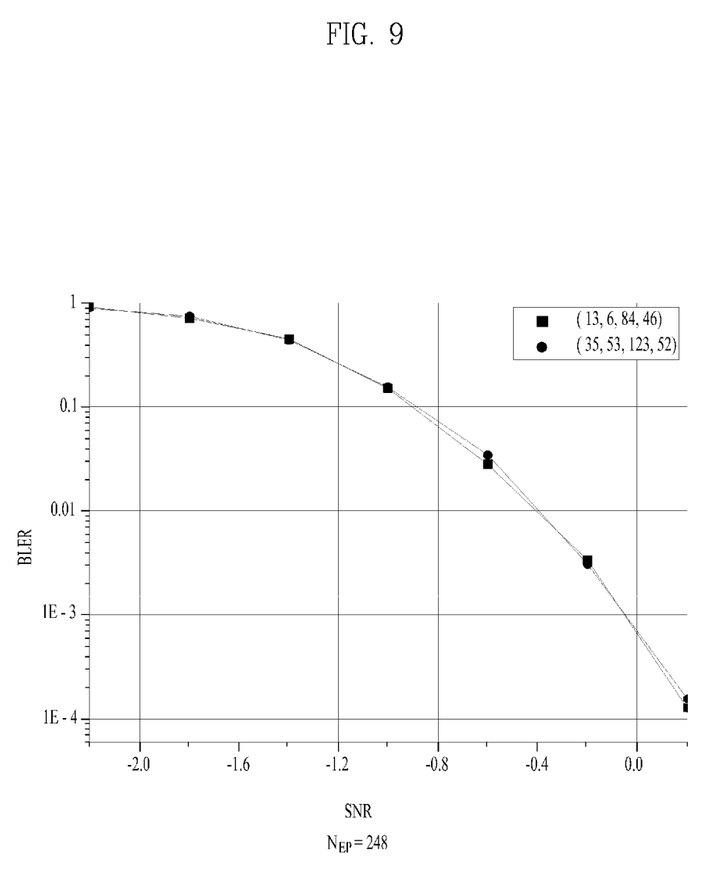

Referring to FIG. 2, the data transmission device according to the present invention includes a constituent encoder 110, a CTC interleaver 120, and a transmission module (not shown).

When data bits (A, B) for coding are simultaneously input to the CTC encoder, the CTC encoder encodes the data bits (A, B) using a Dual Binary Circular Recursive Systematic Convolutional (DB-CRSC) code. Data bits may be input to the CTC encoder on an $N_{EP}$-bit basis ($N_{EP}$=2×N bits) or on an N-bit-pair basis. In this case, $N_{EP}$ indicates the CTC data block size.

The CTC encoder may perform encoding in two steps. In the first step, a switch provided in the CTC encoder is located to position 1 so that data bits (A, B) for coding are input to the constituent encoder 110 after an initialization process is performed through a circular state. In the second step, the switch provided in the CTC encoder is switched to position 2 so that data bits (A, B) interleaved by the CTC interleaver 120 are input to the constituent encoder 110 after an initialization process is performed through a circular state.

The CTC encoder may receive a signal from the outside or from an upper layer and may acquire CTC data block size $N_{EP}$ information which is encodable block size information. In this case, $N_{EP}$=2×N, where N is the actual interleaver size and N=/2.

Data bits (A, B) to be encoded may simultaneously be input to the constituent encoder 110. In this case, the Most Significant Bit (MSB) of data bit streams may be input as the data bit A and a next bit may be input as the data bit B. This procedure may be repeated for the entire bit streams. In this case, the MSB means is a significant number that most significantly affects the magnitude of the value in a bit-based operation. That is, the MSB is the leftmost bit in a bit stream representing the value.

The constituent encoder 110 may encode data bits (A, B) received through two input ports. In this case, the constituent encoder 110 may perform encoding through two encoding steps. The constituent encoder 110 may include a first encoder $C_1$ that encodes the data bits (A, B) received through the two input ports and a second encoder $C_2$ that encodes the data bits (A, B) interleaved by the CTC interleaver 120 after being received through the two input ports. How the data bits are interleaved through the CTC interleaver 220 will be described below in more detail.

The CTC interleaver 120 may interleave the data bits (A, B) received through the two input ports. The CTC interleaver 120 may receive the MSB of a data bit stream as the data bit A and then receive a next bit thereof as the data bit B. This procedure may be repeated for the entire bit streams input to the CTC interleaver 120.

The CTC interleaver 120 randomizes data bit streams input in units of a predetermined size (frame) and uses the data bit streams to improve codeword distance properties.

The CTC encoder may sequentially output the data bits (A, B) input through the two input ports and the data bit values encoded through the constituent encoder 110. For example, the output bits may be "ABY1Y2W1W2" in case of a coding rate of 1/3. The output bits may be "ABY1Y2" through removal of "W1" and "W2" in case of a coding rate of 1/2. In this case, the output data bits (A, B) correspond to a systematic part, and the data bits (Y1, W1) or (Y2, W2) output through the constituent encoder 110 correspond to a parity part. The size of data bits output from the parity part may vary depending on a predetermined coding rate.

The transmission module (not shown) may selectively transmit the input data bits input through the two input ports, first encoded bits output from the first encoder $C_1$, and second encoded bits output from the second encoder $C_2$ to the receiving side.

Hereinafter, the operation of the CTC interleaver 120 will briefly be described. The CTC interleaver 120 performs interleaving through two steps in accordance with CTC interleaver parameters $P_0$, $P_1$, $P_2$, and $P_3$.

In the first step, the CTC interleaver 120 performs bit pair swapping between the data bits (A, B) to be coded. In other words, the CTC interleaver 120 swaps the positions of each pair of bits such that if (j mod 2=0) let (B,A)=(A,B) for j=0, 1, 2, . . . , N−1. For example, let the input sequence be $u_0=[(A_0, B_0), (A_1, B_1), (A_2, B_2), \ldots, (A_{N-1}, B_{N-1})]$. The CTC interleaver 120 performs bit pair swapping on each even permutation symbol in the first step. In this way, when $u_1$ is the bit-pair-swapped sequence, $u_1=[(A_0, B_0), (B_1, A_1), (A_2, B_2), \ldots, (B_{N-1}, A_{N-1})]=[u_1(0), u_1(1), u_1(2), \ldots, u_1(N-1)]$.

In the second step, the CTC interleaver 120 generates an interleaving address for swapped bit pair. The CTC interleaver 120 generates an interleaving address π(j) for a jth bit pair, thereby completing the interleaving process. In this case, π(j) may provide the address of the $u_1$ sequence. That is, $u_2=[(B_{\pi(0)}, A_{\pi(0)}), (A_{\pi(1)}, B_{\pi(1)}), (B_{\pi(2)}, A_{\pi(2)}), \ldots, (A_{\pi(N-1)}, B_{\pi(N-1)})]$, and this sequence $u_2$ may be input to the second encoder.

i=π(j), where j=0, . . . ,N−1 and N mod 4=0 switch(j mod 4):

case 0: π(j)=($P_0 \cdot j$+1)mod N case 1: π(j)=($P_0 \cdot j$+1+N/2+$P_1$)mod N case 2: π(j)=($P_0 \cdot j$+1+$P_2$)mod N case 3: π(j)=($P_0 \cdot j$+1+N/2+$P_3$)mod N  [Equation 1]

As described above, the CTC interleaver 120 may perform interleaving by swapping a pair of bits of each even permutation symbol in the first step and generating an interleaving address on the jth bit pair according to the above Equation in the second step. The generated address may be matched with a data block index, and the CTC interleaver 120 may perform interleaving using the matched data block index and 4 and four CTC interleaver parameters $P_0$, $P_1$, $P_2$ and $P_3$ corresponding to the data block index.

Hereinafter, a method for optimizing the CTC interleaver 120 in the IEEE 802.16m system will be described.

In the first step for optimization, a spatial distance is calculated using a parameter test set. Considering the CTC interleaver structure, the four parameters $P_0$, $P_1$, $P_2$, and $P_3$ preferably have the following characteristics:

i) First, $P_0$ is relatively prime to N;
 ii) $P_1$ is a natural number, which is a multiple of 2, such that $P_1$=0, 2, 4, . . . , N−2;
 iii) $P_2$ is a natural number, which is a multiple of 4, such that P.sub.2=0, 4, 8, . . . , N−4; and
 iv) $P_3$ is a natural number, which is a multiple of 2, such that $P_3$=0, 2, 4, . . . , N−2 when $P_1$ mod 4=2, and is a natural number, which is a multiple of 4, such that $P_3$= 0, 4, 8, . . . , N−4 when $P_1$ mod 4=0.

Meanwhile, the spatial distance may be defined as in the following Equation 2.

$$S(j_1,j_2)=f(j_1,j_2)+f(\pi(j_1),\pi(j_2))$$  [Equation 2]

In this case, f(u,v)=min [|u−v|, k−|u−v|], and f($j_1,j_2$) denotes a spatial distance before interleaving, and f($\pi(j_1)$, $\pi(j_2)$) denotes a spatial distance after interleaving. The spatial distance may be calculated for all index combinations ($j_1$, $j_2$). In addition, $S_{min}$ of spatial distances of the index combinations denotes the minimum spatial distance of the CTC interleaver.

In more detail, a parameter $P_0$, which is relatively prime number to N, will be selected in the following manner.

Preferably, $P_0$ is an integer which is close to $\sqrt{2N}$ while is relatively prime number to N. However, for some data block sizes, $P_0$ may be an integer which is not close to $\sqrt{2N}$ while is relatively prime number to N.

Also, $S_{min}$ may be sorted by magnitude. CTC interleaving patterns may be generated using all combinations ($P_1$, $P_2$, $P_3$)={(0,0,0), (0, 0, 2), . . . , (2, 0, 0), (2, 0, 2 or 4), . . . , (N−2, N−4, N−2 or N−4) together with $P_0$. $S_{min}$ may be calculated for each combination of ($P_1$, $P_2$, $P_3$). After minimum spatial distances $S_{min}$ are calculated respectively for all parameter combinations, the top 5 parameter combinations may be extracted from parameter combinations having the minimum spatial distances when the parameter combinations are sorted in decreasing order of the minimum spatial distance. The 5 parameter combinations having the minimum spatial distances sorted and extracted in this manner may be used in the second step of the method of designing and optimizing CTC interleaver parameters.

In the second step for optimization, a Return To Zero (RTZ) spatial distance may be calculated using the extracted parameter combinations. The RTZ sequence may be represented as follows taking into consideration CTC encoder generation polynomial equations.

TABLE 1

| | | |
|---|---|---|
| idx1-idx2 = 1 | Weight = 6 | 13 |
| idx1-idx2 = 2 | Weight = 7 | 201 |
| idx1-idx2 = 3 | Weight = 9 | 2003 |
| idx1-idx2 = 4 | Weight = 9 | 30002 |
| idx1-idx2 = 5 | Weight = 11 | 100002 |
| idx1-idx2 = 6 | Weight = 10 | 3000001 |
| idx1-idx2 = 7 | Weight = 12 | 10000001 |
| idx1-idx2 = 7 | Weight = 14 | 20000002 |
| idx1-idx2 = 7 | Weight = 12 | 30000003 |
| idx1-idx2 = 8 | Weight = 14 | 100000003 |
| idx1-idx2 = 9 | Weight = 15 | 2000000001 |
| idx1-idx2 = 10 | Weight = 17 | 20000000003 |
| idx1-idx2 = 11 | Weight = 17 | 300000000002 |
| idx1-idx2 = 12 | Weight = 19 | 1000000000002 |
| idx1-idx2 = 13 | Weight = 18 | 30000000000001 |
| idx1-idx2 = 14 | Weight = 20 | 100000000000001 |
| idx1-idx2 = 14 | Weight = 22 | 200000000000002 |
| idx1-idx2 = 14 | Weight = 20 | 300000000000003 |
| . | | |
| . | | |
| . | | |

When the result of interleaving of an RTZ sequence interleaved by applying bit pair swapping to RTZ sequence input in the first step of the interleaving procedure is also an RTZ sequence, a spatial distance may be calculated for the RTZ sequence. In this case, $S_{RTZ,min}$ is the minimum spatial distance of the RTZ sequence.

After minimum spatial distances $S_{RTZ,min}$ are calculated respectively for the each parameter combinations extracted in the first step, the top five minimum spatial distances $S_{RTZ,min}$ may be sorted in decreasing order. Parameter combinations having the minimum RTZ spatial distances may be used in the third step of the method of designing and optimizing CTC interleaver parameters.

In the third step, the minimum distance is calculated using an Error IMpulse (EIM) method.

The EIM method may be performed using 2-bit data input to the CTC encoder. In order to calculate the minimum distance $d_{min}$ using interleaving patterns generated by the parameter combinations, the EIM method may be performed by each of the first and second encoders twice using the input bits A and B. Thus, the minimum distance of code may be checked using the EIM method. Max-Log-MAP decoding having 64 repetitions may be used for the EIM method. This may be represented by the following algorithm.

TABLE 2

- set $A_{min} = d_1 + 0.5$
- for i = 1 to n do
  - A = $d_0$ − 0.5;
  - set [($\hat{x}$ = x) = TRUE];
  - while [($\hat{x}$ = x) = TRUE] and (A ≤ $A_{min}$ − 1.0)
    do
    * A = A + 1.0;
    * y = (−1,...,−1,−1 + A,−1,...,−1)
      where −1 + A is in position i;
    * ML decoding of y ⇒ $\hat{x}$
    * if ($\hat{x}$ ≠ x) then [($\hat{x}$ = x) = FALSE];
  end while
  - $A_{min}$ = A
end for
- $d_{min}$ is the integer part of $A_{min}$ After minimum distances $d_{min}$ are calculated respectively for the each parameter combinations in the third step for optimization, the top three minimum distances $d_{min}$ may be obtained in such a manner that the calculated minimum distances $d_{min}$ are sorted in decreasing order. Parameter combinations having the three minimum distances obtained in this manner may be used in the last step, namely, the fourth step, of the method of designing and optimizing CTC interleaver parameters. In this case, the minimum distance may represent a measure of performance, and performance generally increases as the minimum distance increases.

In the fourth step for optimization, performance is estimated using mother code rates of 1/2 and 1/3. A BLock Error Rate (BLER) may be estimated after the mother code rate is set to 1/2 and 1/3 for the parameter combinations extracted in the third step. Parameter combinations which exhibit the highest performance for all the mother code rates 1/2 and 1/3 for each data block size may be selected after performance is estimated.

The following Table 3 is the preferred embodiment of the data block size used for interleaving, and illustrates 39 data block sizes and CTC interleaver parameter values corresponding to the 39 data block sizes.

TABLE 3

| $N_{EP}$ | $P_0$ | $P_1$ | $P_2$ | $P_3$ |
|---|---|---|---|---|
| 48 | 5 | 0 | 0 | 0 |
| 64 | 11 | 12 | 0 | 12 |
| 72 | 11 | 18 | 0 | 18 |
| 80 | 7 | 4 | 32 | 36 |
| 88 | 13 | 36 | 36 | 32 |
| 96 | 13 | 24 | 0 | 24 |
| 104 | 7 | 4 | 8 | 48 |
| 120 | 11 | 30 | 0 | 34 |
| 136 | 13 | 58 | 4 | 58 |
| 152 | 11 | 38 | 12 | 74 |
| 176 | 17 | 52 | 68 | 32 |
| 200 | 11 | 76 | 0 | 24 |
| 216 | 11 | 54 | 56 | 2 |
| 248 | 13 | 6 | 84 | 46 |
| 288 | 17 | 74 | 72 | 2 |
| 320 | 17 | 84 | 108 | 132 |
| 352 | 17 | 106 | 56 | 50 |
| 400 | 19 | 142 | 0 | 142 |
| 456 | 17 | 184 | 0 | 48 |
| 512 | 19 | 64 | 52 | 124 |
| 568 | 19 | 102 | 140 | 226 |
| 640 | 23 | 84 | 296 | 236 |
| 720 | 23 | 130 | 156 | 238 |
| 800 | 23 | 150 | 216 | 150 |
| 912 | 29 | 14 | 264 | 94 |
| 1024 | 29 | 320 | 236 | 324 |
| 1160 | 31 | 314 | 348 | 222 |
| 1312 | 31 | 214 | 160 | 506 |
| 1448 | 33 | 254 | 372 | 158 |
| 1640 | 33 | 164 | 432 | 748 |
| 1864 | 33 | 504 | 444 | 664 |
| 2096 | 39 | 400 | 688 | 68 |
| 2328 | 41 | 254 | 884 | 1054 |
| 2624 | 47 | 378 | 1092 | 1250 |
| 2944 | 41 | 338 | 660 | 646 |
| 3328 | 37 | 258 | 28 | 1522 |
| 3776 | 53 | 772 | 256 | 408 |
| 4224 | 59 | 14 | 668 | 1474 |
| 4800 | 53 | 66 | 24 | 2 |

In the meantime, among the CTC interleaver parameters illustrated in the above Table 3, if $N_{EP}$ is 88, 104, 120, 136, 152, 200, 216, 248, 456 and 568, a problem occurs in that the interleaver cannot assure a parallel order 2. In other words, in case of $$\frac{N}{2} \mod 4 = 2,$$

a problem occurs in that the following Equation 3 which corresponds to requirements of the CTC interleaver in case of a parallel order 2 is not satisfied.

$$\left\lceil \frac{\pi(x)}{N/2} \right\rceil \ne \left\lceil \frac{\pi(x+N/2)}{N/2} \right\rceil, \quad \text{[Equation 3]}$$

where $x = 0, \ldots, N/2 - 1$

The Equation 3 represents that output data bits should exist in different memories even after CTC interleaving.

Accordingly, in order to determine parameters that satisfy requirements of the CTC interleaver in case of a parallel order 2, the present invention suggests that the parameter test set should be determined, as follows, in the first step for optimization.

First of all, in case of $$\frac{N}{2} \bmod 4 = 2,$$

$P_0$ is assumed as expressed by the following Equation 4, and $P_2$ is assumed as N−1.

$$P_0 = 2a+1 \text{ and } GCD(P_0, N) = 1 \quad \text{[Equation 4]}$$

The Equation 4 represents that $P_0$ is an odd number, and is relative prime number to N.

Also, since $P_2$ is assumed as N−1, the above Equation 1 may be expressed by the following Equation 5.

$$j = 4x + y, \text{ where } x = 0, \ldots, N/4-1 \text{ and } y = 0, \ldots, 3$$

switch y:

case 0: $\pi(4x) = (P_0 \cdot 4x + 1) \bmod N$ case 1: $\pi(4x+1) = (P_0 \cdot (4x+1) + 1 + N/2 + p) \bmod N$ case 2: $\pi(4x+2) = (P_0 \cdot (4x+2) + 1 + (N-1)) \bmod N$ case 3: $\pi(4x+3) = (P_0 \cdot (4x+3) + 1 + N/2 + P_3) \bmod N$ [Equation 5]

In this case, it is noted that the Equation 5 satisfies a condition of the following Equation 6.

$$\pi(4x) \bmod 4 \ne \pi(4x+1) \bmod 4 \ne \pi(4x+2) \bmod 4 \ne \pi(4x+3) \bmod 4 \quad \text{[Equation 6]}$$

In the meantime, in case of N mod 4=0, since (X mod N) mod 4 = X mod 4, the Equation 5 may depend on a value of y.

First of all, if y is 0, since $P_0$ is an odd number in accordance with the Equation 4, the case 0 is expressed by the following Equation 7.

$$\pi(4x) \bmod 4 = (P_0 \cdot 4x + 1) \bmod 4 = 1 \quad \text{[Equation 7]}$$

Also, since $P_0$ is an odd number in accordance with the Equation 4 even if y is 2, the case 2 is expressed by the following Equation 8.

$$\pi(4x+2) \bmod 4 = (P_0 \cdot (4x+2) + 1 + N - 1) \bmod 4 = (P_0 \cdot 2) \bmod 4 = 2 \quad \text{[Equation 8]}$$

Finally, if y is 1 or 3, the case 1 and case 3 are expressed by the following Equation 9.

If $\pi(4x+1) \bmod 4 = 0$, then $\pi(4x+3) \bmod 4 = 3$ [Equation 9]

Else $\pi(4x+1) \bmod 4 = 3$, then $\pi(4x+3) \bmod 4 = 1$, where $$\pi(4x+1) \bmod 4 = (P_0 \cdot (4x+1) + 1 + N/2 + P_1) \bmod 4$$
$$= (P_0 + 1 + 2 + P_1) \bmod 4$$
$$= (2a + P_1) \bmod 4$$

$$\pi(4x+3) \bmod 4 = (P_0 \cdot (4x+3) + 1 + N/2 + P_3) \bmod 4$$
$$= (3 \cdot P_0 + 1 + 2 + P_3) \bmod 4$$
$$= (6a + 2 + P_3) \bmod 4$$

Referring to the Equation 9, features of $P_1$ and $P_3$ are varied as expressed by the following Equations 10 and 11 depending on whether a value of a is an odd number or an even number.

If $a \bmod 2 = 0$,

For $\pi(4x+1) \bmod 4 = 0$ and $\pi(4x+3) \bmod 4 = 3$ $P_1$ shall be $P_1 \bmod 4 = 0$ and $P_3$ shall be $P_3 \bmod 4 = 1$ For $\pi(4x+1) \bmod 4 = 3$ and $\pi(4x+3) \bmod 4 = 0$ $P_1$ shall be $P_1 \bmod 4 = 3$ and $P_3$ shall be $P_3 \bmod 4 = 2$ [Equation 10]

If $a \bmod 2 = 1$,

For $\pi(4x+1) \bmod 4 = 0$ and $\pi(4x+3) \bmod 4 = 3$ $P_1$ shall be $P_1 \bmod 4 = 2$ and $P_3$ shall be $P_3 \bmod 4 = 3$ For $\pi(4x+1) \bmod 4 = 3$ and $\pi(4x+3) \bmod 4 = 0$ $P_1$ shall be $P_1 \bmod 4 = 1$ and $P_3$ shall be $P_3 \bmod 4 = 0$ [Equation 11]

Referring to the Equations 10 and 11, in order to satisfy the Equation 3 which corresponds to requirements of the CTC interleaver in case of a parallel order 2, it is noted that $|P_1 - P_3| = 1$ should be satisfied. This will be described in more detail.

If k mod 4=0 for an arbitrary integer $$k\left(=0, \ldots, \frac{N}{2}-1\right),$$

since $$\frac{N}{2} \bmod 4 = 2, \left(k + \frac{N}{2}\right) \bmod 4 = 2$$

is satisfied. In this case, in the CTC interleaver of which parallel order is 2, $\pi(k)$ and $\pi(k+N/2)$ which are output to their respective memory banks different from each other may be expressed by the following Equation 12.

$$\pi(k) = (P_0 \cdot k + 1) \bmod N \quad \text{[Equation 12]}$$

$$\pi(k + N/2) \bmod N = (P_0 \cdot (k + N/2) + 1 + N - 1) \bmod N$$
$$= (P_0 \cdot k + 1 + P_0 \cdot N/2) \bmod N$$

Referring to the Equation 12, since $(P_0 \cdot N/2) \bmod N = N/2$ and $P_0$ is an odd number, it is noted that $$\left\lceil \frac{\pi(k)}{N/2} \right\rceil \neq \left\lceil \frac{\pi(k+N/2)}{N/2} \right\rceil.$$

However, if k mod 4=1, since $$\frac{N}{2} \bmod 4 = 2, \left(k + \frac{N}{2}\right) \bmod 4 = 3$$

satisfied. In this case, in the CTC interleaver of which parallel order is 2, π(k) and π(k+N/2) which are output to their respective memory banks different from each other may be expressed by the following Equation 13.

$$\pi(k) = (P_0 \cdot k + 1 + N/2 + P_1) \bmod N \quad \text{[Equation 13]}$$

$$\pi(k+N/2) \bmod N = (P_0 \cdot (k+N/2) + 1 + N/2 + P_3) \bmod N$$
$$= (P_0 \cdot k + 1 + P_0 \cdot N/2 + N/2 + P_3) \bmod N$$
$$= (P_0 \cdot k + 1 + P_3) \bmod N$$

Referring to the Equation 13, since π(k) and π(k+N/2) should be output to their respective memory banks different from each other, that is, $$\left\lceil \frac{\pi(k)}{N/2} \right\rceil \neq \left\lceil \frac{\pi(k+N/2)}{N/2} \right\rceil$$

should be obtained, it is noted that $$\left\lceil \frac{\pi(k) + N/2}{N/2} \right\rceil = \left\lceil \frac{\pi(k+N/2)}{N/2} \right\rceil.$$

Accordingly, π(k) may be expressed by the following Equation 14.

$$\pi(k) + N/2 = (P_0 \cdot k + 1 + P_1) \bmod N \quad \text{[Equation 14]}$$

Moreover, if k mod 4=3, since $$\frac{N}{2} \bmod 4 = 2, \left(k + \frac{N}{2}\right) \bmod 4 = 1$$

satisfied. In this case, in the CTC interleaver of which parallel order is 2, π(k) and π(k+N/2) which are output to their respective memory banks different from each other may be expressed by the following Equation 15.

$$\pi(k) = (P_0 \cdot k + 1 + N/2 + P_3) \bmod N \quad \text{[Equation 15]}$$

$$\pi(k+N/2) \bmod N = (P_0 \cdot (k+N/2) + 1 + N/2 + P_1) \bmod N$$
$$= (P_0 \cdot k + 1 + P_0 \cdot N/2 + N/2 + P_1) \bmod N$$
$$= (P_0 \cdot k + 1 + P_1) \bmod N$$

Referring to the Equation 15, in the same manner as the Equation 13, since π(k) and π(k+N/2) should be output to their respective memory banks different from each other, that is, $$\left\lceil \frac{\pi(k)}{N/2} \right\rceil \neq \left\lceil \frac{\pi(k+N/2)}{N/2} \right\rceil$$

should be obtained, it is noted that $$\left\lceil \frac{\pi(k) + N/2}{N/2} \right\rceil = \left\lceil \frac{\pi(k+N/2)}{N/2} \right\rceil.$$

Accordingly, π(k) may be expressed by the following Equation 16.

$$\pi(k) + N/2 = (P_0 \cdot k + 1 + P_3) \bmod N \quad \text{[Equation 16]}$$

Referring to the Equations 14 and 16, the following Equations 17 and 18 may be obtained.

$$|P_1 - P_3| < \min_k(N - (P_0 \cdot k + 1) \bmod N), \quad \text{[Equation 17]}$$

where $k \bmod 2 = 1$ $$\min_k(N - (P_0 \cdot k + 1) \bmod N) = 2, \quad \text{[Equation 18]}$$

where $k \bmod 2 = 1$

In accordance with the Equations 17 and 18, it is approved that $|P_1-P_3|=1$ be obtained.

Based on the aforementioned description, if the data block size $N_{EP}$ satisfies $$\frac{N}{2} \bmod 4 = 2$$

(but, $N=N_{EP}/2$), $P_0$ is assumed as the Equation 4, $P_2$ is assumed as N−1, and $P_1$ and $P_3$ are assumed as a value that satisfies a condition of $|P_1-P_3|=1$, whereby the parameter test set is determined in the first step for optimization.

The following Table 4 illustrates a CTC interleaver parameter value that satisfies a parallel order 2 according to the present invention.

TABLE 4

| $N_{EP}$ | N | $P_0$ | $P_1$ | $P_2$ | $P_3$ |
|---|---|---|---|---|---|
| 88 | 44 | 29 | 28 | 43 | 29 |
| 104 | 52 | 11 | 1 | 51 | 0 |
| 120 | 60 | 19 | 58 | 59 | 59 |
| 136 | 68 | 39 | 37 | 67 | 36 |
| 152 | 76 | 29 | 39 | 75 | 38 |
| 200 | 100 | 27 | 97 | 99 | 96 |
| 216 | 108 | 41 | 28 | 107 | 29 |
| 248 | 124 | 35 | 53 | 123 | 52 |
| 456 | 228 | 13 | 192 | 227 | 193 |
| 568 | 284 | 23 | 50 | 283 | 51 |

FIGS. 2 to 9 illustrate the simulation result of a BLock Error Rate (BLER) for each of a current CTC interleaver parameter in Table 3 and a CTC interleaver parameter of the present invention in Table 4.

Referring to FIGS. 2 to 9, it is noted that the CTC interleaver parameter of the present invention exhibits performance the same as or more excellent than the CTC interleaver parameter of the related art under the condition that satisfies a parallel order 2.

The aforementioned embodiments are achieved by combination of structural elements and features of the present invention in a predetermined type. Each of the structural elements or features should be considered selectively unless specified separately. Each of the structural elements or features may be carried out without being combined with other structural elements or features. Also, some structural elements and/or features may be combined with one another to constitute the embodiments of the present invention. The order of operations described in the embodiments of the present invention may be changed. Some structural elements or features of one embodiment may be included in another embodiment, or may be replaced with corresponding structural elements or features of another embodiment. Moreover, it will be apparent that some claims referring to specific claims may be combined with another claims referring to the other claims other than the specific claims to constitute the embodiment or add new claims by means of amendment after the application is filed.

The embodiments according to the present invention may be implemented by various means, for example, hardware, firmware, software, or their combination. If the embodiment according to the present invention is implemented by hardware, the embodiment of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, etc.

If the embodiment according to the present invention is implemented by firmware or software, the embodiment of the present invention may be implemented by a type of a module, a procedure, or a function, which performs functions or operations described as above. A software code may be stored in a memory unit and then may be driven by a processor. The memory unit may be located inside or outside the processor to transmit and receive data to and from the processor through various means which are well known.

It will be apparent to those skilled in the art that the present invention may be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

INDUSTRIAL APPLICABILITY

The device and method for transmitting data using a convolutional turbo code (CTC) encoder according to the present invention may industrially be used.

The invention claimed is:

1. A method for transmitting data using a convolutional turbo code (CTC) encoder from a transmitting side in a mobile communication system, the method comprising:
 a first encoding to output first encoded bits, by encoding input data bits, which have been input through two input ports of the CTC encoder;
 interleaving the input data bits using four CTC interleaver parameters $P_0$, $P_1$, $P_2$ and $P_3$ corresponding to sizes of the input data bits;
 a second encoding to output second encoded bits, by encoding the interleaved data bits; and
 selectively transmitting, to a receiving side, the input data bits, the first encoded bits and the second encoded bits, in accordance with a predetermined coding rate,
 wherein, when the size of each of the input data bits is one of 88, 104, 120, 136, 152, 200, 216, 248, 456 and 568, with respect to the CTC interleaver parameters corresponding to the sizes of the input data bits, $P_0$ is a relative prime number to N, which is ½ of the size of each of the input data bits, $P_2$ has a value of N−1, and an absolute value of a difference between $P_1$ and $P_3$ is 1.

2. The method according to claim 1, wherein N which is ½ of the size of each of the input data bits satisfies the following Equation A:

$$\frac{N}{2} \bmod 4 = 2. \qquad \langle\text{Equation A}\rangle$$

3. The method according to claim 1, wherein the interleaving the input data bits is performed by the following Equation C:

switch($j$ mod 4):

case 0: $\pi(j)\_(P_3 \cdot j+1) \bmod N$ case 1: $\pi(j)=(P_0 \cdot j+1+N/2+P_1) \bmod N$ case 2: $\pi(j)=(P_0 \cdot j+1+P_2) \bmod N$ case 3: $\pi(j)=(P_0 \cdot j+1+N/2+P_3) \bmod N$  <Equation C>

(but, π(j) indicates an address of the jth bit, which is to be interleaved).

4. A mobile station in a mobile communication system, the mobile station comprising:
 a first convolutional turbo code (CTC) encoder encoding input data bits, which have been input through two input ports, to output first encoded bits;
 a CTC interleaver interleaving the input data bits using four CTC interleaver parameters $P_0$, $P_1$, $P_2$ and $P_3$ corresponding to sizes of the input data bits;
 a second CTC encoder encoding the interleaved data bits to output second encoded bits; and
 a transmission module selectively transmitting, to a receiving side, the input data bits, the first encoded bits and the second encoded bits, in accordance with a predetermined coding rate,
 wherein, when the size of each of the input data bits is one of 88, 104, 120, 136, 152, 200, 216, 248, 456 and 568, with respect to the CTC interleaver parameters corresponding to the sizes of the input data bits, $P_0$ is a relative prime number to N, which is ½ of the size of each of the input data bits, $P_2$ has a value of N−1, and an absolute value of a difference between $P_1$ and $P_3$ is 1.

5. The mobile station according to claim 4, wherein N which is ½ of the size of each of the input data bits satisfies the following Equation A:

$$\frac{N}{2} \bmod 4 = 2. \qquad \langle\text{Equation A}\rangle$$

6. The mobile station according to claim 4, wherein the interleaver interleaves the input data bits by the following Equation C:

switch($j$ mod 4):

case 0: $\pi(j)\_(P_3 \cdot j+1) \bmod N$ case 1: $\pi(j)=(P_0 \cdot j+1+N/2+P_1) \bmod N$ case 2: $\pi(j)=(P_0 \cdot j+1+P_2) \bmod N$ case 3: $\pi(j)=(P_0 \cdot j+1+N/2+P_3) \bmod N$ <Equation C>

(but, π(j) indicates an address of the jth bit, which is to be interleaved).

7. The method according to claim 1, wherein the CTC interleaver parameters $P_0$, $P_1$, $P_2$ and $P_3$ corresponding to the sizes of the input data bits are defined by the following Table B:

| $N_{EP}$ | N | $P_0$ | $P_1$ | $P_2$ | $P_3$ |
|---|---|---|---|---|---|
| 88 | 44 | 29 | 28 | 43 | 29 |
| 104 | 52 | 11 | 1 | 51 | 0 |
| 120 | 60 | 19 | 58 | 59 | 59 |
| 136 | 68 | 39 | 37 | 67 | 36 |
| 152 | 76 | 29 | 39 | 75 | 38 |
| 200 | 100 | 27 | 97 | 99 | 96 |
| 216 | 108 | 41 | 28 | 107 | 29 |
| 248 | 124 | 35 | 53 | 123 | 52 |
| 456 | 228 | 13 | 192 | 227 | 193 |
| 568 | 284 | 23 | 50 | 283 | 51 |

8. The mobile station according to claim 4, wherein the CTC interleaver parameters $P_0$, $P_1$, $P_2$ and $P_3$ corresponding to the sizes of the input data bits are defined by the following Table B:

TABLE B

| $N_{EP}$ | N | $P_0$ | $P_1$ | $P_2$ | $P_3$ |
|---|---|---|---|---|---|
| 88 | 44 | 29 | 28 | 43 | 29 |
| 104 | 52 | 11 | 1 | 51 | 0 |
| 120 | 60 | 19 | 58 | 59 | 59 |
| 136 | 68 | 39 | 37 | 67 | 36 |
| 152 | 76 | 29 | 39 | 75 | 38 |
| 200 | 100 | 27 | 97 | 99 | 96 |
| 216 | 108 | 41 | 28 | 107 | 29 |
| 248 | 124 | 35 | 53 | 123 | 52 |
| 456 | 228 | 13 | 192 | 227 | 193 |
| 568 | 284 | 23 | 50 | 283 | 51 |

\* \* \* \* \*